United States Patent [19]

Komori et al.

[11] Patent Number: 5,045,901

[45] Date of Patent: Sep. 3, 1991

[54] DOUBLE DIFFUSION METAL-OXIDE-SEMICONDUCTOR DEVICE HAVING SHALLOW SOURCE AND DRAIN DIFFUSED REGIONS

[75] Inventors: Shigeki Komori; Katsuhiro Tsukamoto, both of Hyogo, Japan

[73] Assignee: Mitsubishi Denki Kabushiki Kaisha, Tokyo, Japan

[21] Appl. No.: 577,711

[22] Filed: Sep. 5, 1990

Related U.S. Application Data

[62] Division of Ser. No. 410,203, Sep. 21, 1989, Pat. No. 4,978,629.

[30] Foreign Application Priority Data

Oct. 3, 1988 [JP] Japan ................................ 63-249347

[51] Int. Cl.⁵ .................... H01L 29/10; H01L 29/78; H01L 27/02; H01L 29/04
[52] U.S. Cl. .................................... 357/23.4; 357/42; 357/59; 357/63
[58] Field of Search ...................... 357/23.4, 59, 63, 42

[56] References Cited

U.S. PATENT DOCUMENTS

| | | | |
|---|---|---|---|
| 4,063,967 | 12/1977 | Gravl et al. ........................ | 437/46 |
| 4,274,892 | 6/1981 | Templin ............................ | 148/188 |
| 4,305,760 | 12/1981 | Trudel ............................ | 148/1.005 |
| 4,324,038 | 4/1982 | Chang ............................ | 29/571 |
| 4,419,810 | 12/1983 | Riseman ........................... | 29/571 |
| 4,486,266 | 12/1984 | Yamaguchi ....................... | 156/643 |
| 4,488,162 | 12/1984 | Jambotkar ........................ | 357/23 |
| 4,513,303 | 4/1985 | Abbas et al. ..................... | 357/23.3 |
| 4,546,535 | 10/1985 | Shepard ........................... | 357/59 J |
| 4,656,492 | 4/1987 | Sunami et al. .................... | 357/23.4 |
| 4,757,028 | 7/1988 | Kondoh et al. ................... | 437/40 |
| 4,759,822 | 7/1988 | Velanen ........................... | 156/644 |
| 4,789,644 | 12/1988 | Meda ............................... | 437/41 |
| 4,822,754 | 4/1989 | Lynch et al. ..................... | 437/193 |
| 4,830,972 | 5/1989 | Hamasaki ......................... | 437/37 |
| 4,845,046 | 7/1989 | Shimbo ............................ | 437/41 |
| 4,907,048 | 3/1990 | Huang ............................. | 357/23.4 |
| 4,924,277 | 3/1990 | Yamane et al. .................... | 357/23.4 |
| 4,928,156 | 5/1990 | Alvis et al. ...................... | 357/23.4 |
| 4,935,379 | 6/1990 | Toyoshima ....................... | 357/23.4 |
| 4,939,558 | 7/1990 | Smayling et al. .................. | 357/23.4 |
| 4,949,136 | 8/1990 | Jain ................................. | 357/23.4 |

FOREIGN PATENT DOCUMENTS

| | | | |
|---|---|---|---|
| 54-88783 | 7/1979 | Japan . | |
| 56-147466 | 11/1981 | Japan ............................. | 357/23.4 |
| 57-149774 | 9/1982 | Japan ............................. | 357/23.4 |
| 58-153368 | 9/1983 | Japan ............................. | 357/23.4 |
| 61-222260 | 3/1985 | Japan ............................. | 357/23.4 |
| 60-198866 | 10/1985 | Japan ............................. | 357/23.4 |
| 60-226120 | 11/1985 | Japan ............................. | 357/23.4 |
| 61-16573 | 1/1986 | Japan . | |

OTHER PUBLICATIONS

T. H. Ning, "Silicon-Gate Mosfet with Self-Aligned Buried Source and Drain Contacts", IBM Technical Disclosure Bulletin, vol. 23, No. 11 (Apr. 1981), pp. 5190-5193.

Primary Examiner—Andrew J. James
Assistant Examiner—Cynthia S. Deal
Attorney, Agent, or Firm—Lowe, Price, LeBlanc and Becker

[57] ABSTRACT

A MOS transistor comprises source and drain impurity regions on a surface of a silicon substrate. The source and drain regions have a double diffusion structure including impurity regions of high concentration and impurity regions of low concentration surrounding the high-concentration impurity regions. Outgoing electrode layers of polysilicon are formed on surfaces of the source and drain impurity regions. A gate electrode is formed to partially extend over the outgoing electrode layers for the source and drain impurity regions. The source and drain impurity regions are formed by implanting impurities into the electrode layers and subsequently diffusing the impurities into the semiconductor substrate by thermal diffusion. Those processes of impurity implantation and thermal diffusion are effected after completion of the step of patterning the gate electrode. Since thermal diffusion of the impurity implantation for the source and drain regions occurs as a final heat treatment step in the process, the depth of the impurity implanted regions can be precisely controlled.

5 Claims, 6 Drawing Sheets

DOUBLE DIFFUSION METAL-OXIDE-SEMICONDUCTOR DEVICE HAVING SHALLOW SOURCE AND DRAIN DIFFUSED REGIONS

This application is a division of application Ser. No. 07/410,203 filed Sept. 21, 1989, now U.S. Pat. No. 4,978,629.

BACKGROUND OF THE INVENTION

1. Field of the Invention

The present invention relates generally to semiconductor devices and more particularly to metal-oxide-semiconductor devices having shallow source and drain regions, and a method of manufacturing thereof. The present invention is particularly utilizable in the field of PSD (Poly-silicon Source and Drain) structure of semiconductor devices.

2. Description of the Prior Art

Recently, semiconductor devices have been developed for the purposes of enhancing integration scales of semiconductor devices and improving reliability thereof according to an increasing demand for higher techniques. Those purposes are in some aspect contradictory. Enhancement of integration scales of semiconductor devices might cause lowering of reliability thereof to the contrary. Consequently, techniques which can accomplish both of those purposes will be very useful.

One of typical semiconductor devices is a MOS (metal oxide semiconductor) transistor. Technical developments have been also promoted in such MOS transistors for the purposes of fine reduction of device structures and improvement of reliability. An example of a fine structure of a MOS transistor is indicated in Japanese Patent Laying-Open No. 16573/1986. This MOS transistor, having a so-called PSD structure will be described in the following.

Figure 4A:
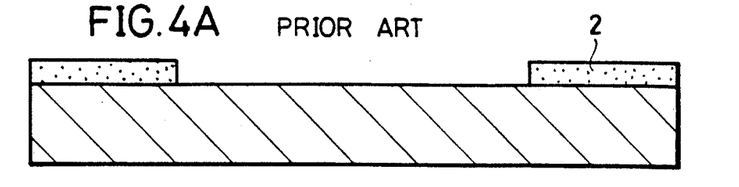
FIGS. 4A to 4G are sectional views showing successive steps of a conventional method of manufacturing a MOS transistor.
Figure 4B:
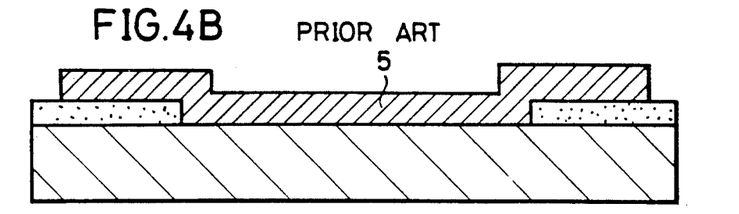
Figure 4C:
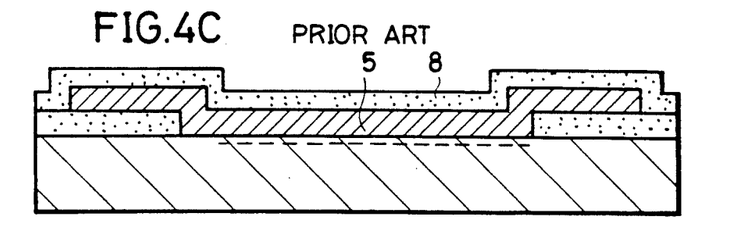
Figure 4D:
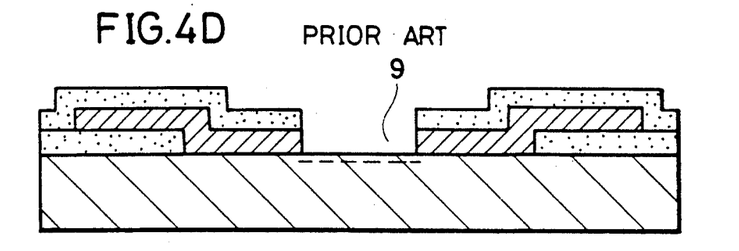
Figure 4E:
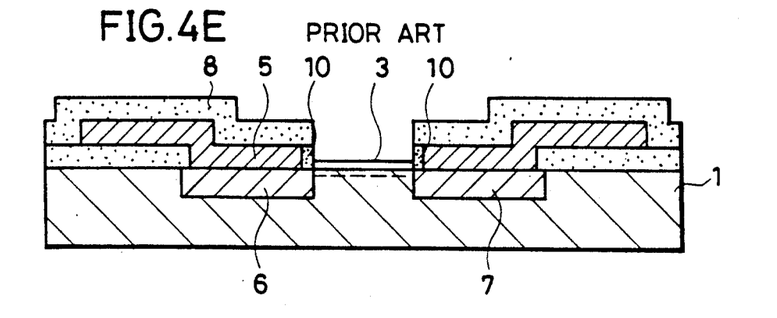
Figure 4F:
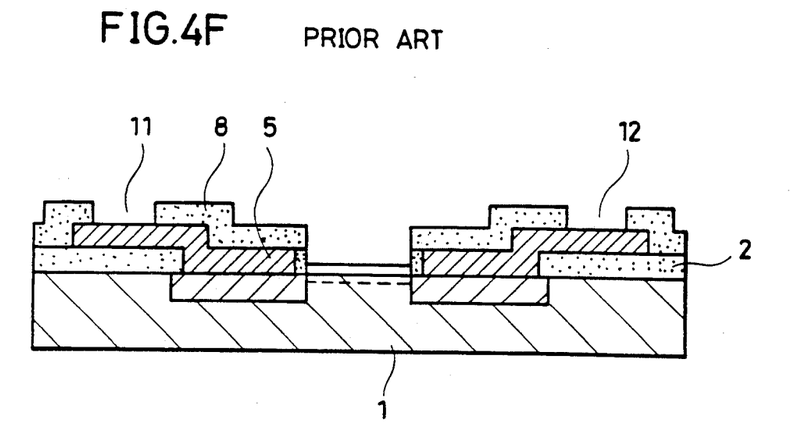
Figure 4G:
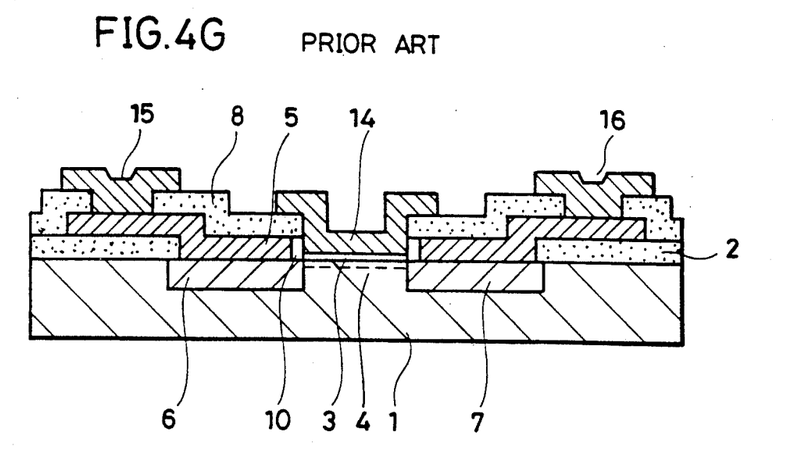

Referring first to FIG. 4G, the structure of the MOS transistor will be described. Source and drain regions 6 and 7 are formed to be spaced from each other on a surface region of a silicon substrate 1. Electrode layers 5 of polysilicon are formed on surfaces of the source and drain regions 6 and 7. Those electrode layers 5 extend over upper surfaces of an oxide film 2 for device isolation. A surface region of the silicon substrate 1 placed between the source and drain regions 6 and 7 is called a channel region 4. A gate electrode layer 14 of polysilicon is formed on the channel region 4 through a gate oxide film 3. The gate electrode layer 14 is insulated between the respective electrode layers 5 through an insulating film 8. Some portions of the gate electrode 14 extend over upper surfaces of the electrode layers 5 through the insulating film 8. The outgoing electrode layers 5 from the source and drain regions 6 and 7 are connected with a source electrode connection layer 15 and a drain electrode connection layer 16 located above the isolation oxide film 2.

This prior art transistor has the below described features from a viewpoint of fine reduction of the structure.

(1) The gate electrode layer 14 has a form in which a gate electrode width in a lower portion and that in an upper portion are different. The electrode width in the lower portion of the gate electrode layer 14 is shorter and a channel length of the MOS transistor defined by this width is reduced. The electrode width of the upper portion of the gate electrode layer 14 is larger and this serves to suppress reduction of a sectional area of the gate electrode layer 14. Suppression of the reduction of the sectional area of the gate electrode layer 14 makes it possible to prevent increase of a connection resistance of the gate electrode layer 14.

(2) The source region 6 and the drain region 7 are brought into contact with the electrode connection layers 15 and 16 through the electrode layers 5 over the isolation oxide film 2. In consequence, it is not necessary to provide space for direct contact between the source and drain regions 6 and 7 and the electrode connections 15 and 16. As a result, a diffusion area of impurity in the source and drain regions 6 and 7 can be reduced.

Next, a method of manufacturing the above described MOS transistor will be described with reference to FIGS. 4A to 4G.

First, as shown in FIGS. 4A, an isolation oxide film for device isolation is formed on a surface of a silicon substrate 1 by using a thermal oxidation process.

Then, as shown in FIG. 4B, a polycrystal silicon film containing impurity of a conductivity type opposite to that of the silicon substrate 1 is formed thereon.

Further, as shown in FIG. 4C, a silicon oxide film 8 is deposited over the polycrystal silicon film 5.

After that, as shown in FIG. 4D, the silicon oxide film 8 and the polycrystal silicon film 5 are selectively removed by using a photolithographic process and a plasma dry etching process, whereby an opening 9 is formed.

Then, as shown in FIG. 4E, heat treatment is applied in an oxidizing atmosphere, whereby a gate oxide film 3 is formed on the surface of the silicon substrate 1 exposed in the opening 9 and at the same time sidewalls of the polycrystal silicon film 5 facing the opening 9 are oxidized to form a sidewall oxide film 10. Then, heat treatment is applied in a nitrifying atmosphere, whereby the impurity contained in the polycrystal silicon film 5 is diffused into the silicon substrate 1 to form a source region 6 and a drain region 7.

Further, as shown in FIG. 4F, the silicon oxide film 8 is selectively removed to provide contact holes 11 and 12 which allow contact between the polycrystal silicon film 5 for the source and drain electrodes and connection layers.

Further, as shown in FIG. 4G, a polycrystal silicon film is deposited over the whole surface and patterned in a desired form. As a result, a gate electrode layer 14 and connection layers 15 and 16 for the source and drain electrodes are formed.

Thus, in this prior art example, the source and drain regions 6 and 7 are formed on the surface of the silicon substrate 1 by thermal diffusion of the impurity contained in the polycrystal silicon film 5.

Usually, in a MOS transistor, the device structure is finely reduced according to a proportional reduction ratio so as not to deteriorate characteristics of the transistor. For this purpose, it is necessary to form source and drain regions with an impurity diffusion depth as shallow as possible. In the conventional method of manufacturing a MOS transistor as described above, the source and drain regions are formed by thermal diffusion of the impurity from the polycrystal silicon film. Thus, the impurity contained in the polycrystal silicon film is easily diffused into the silicon substrate 1 since the polycrystal silicon film is exposed to high temperatures in various manufacturing steps for the transistor. For example, in the step shown in FIG. 4C, when the silicon oxide film 8 is deposited by a CVD method, the impurity contained in the polycrystal silicon film 5 is diffused into the silicon substrate 1 as this film is exposed to a high temperature of about 850° C. In this case, impurity of a conductivity type opposite to that of the silicon substrate 1 is diffused into a region to be a channel region on the surface of the silicon substrate 1. If the concentration of the thus diffused impurity exceeds a predetermined value, the transistor manufactured does not operate.

In addition, in the step shown in FIG. 4E, the impurity contained in the polycrystal silicon film 5 is easily diffused into the silicon substrate 1 also by thermal oxidation for forming the gate oxide film 3. Further, a thermal diffusion process for forming the source and drain regions 6 and 7 is applied thereafter.

Thus, the source and drain regions 6 and 7 are formed by several thermal processes in the manufacturing steps of the MOS transistor. Therefore, the impurity is easily diffused into the silicon substrate 1 and it is difficult to control the diffusion to form a shallow diffusion depth. In addition, the source and drain regions subjected to those thermal processes extend also along the flat surface of the semiconductor substrate, causing a decrease in an effective channel width of the transistor. As a result, the so-called short channel effect occurs conspicuously, causing deterioration of the characteristics of the transistor.

The well-known DDD structure is adopted to reduce the short channel effect by forming source and drain regions with double diffused structure including a lower impurity concentration layer underlying and surrounding a higher impurity concentration region. This DDD structure reduces the short channel effect because the graded impurity density profile of the structure reduces the size of the depletion field in the channel region of the device. However, no means for applying such a DDD structure to a MOS transistor having a PSD structure has been realized.

SUMMARY OF THE INVENTION

An object of the present invention is to improve electric characteristics of a MOS transistor having a fine structure.

Another object of the present invention is to provide a structure which makes it possible to prevent a short channel effect in a MOS transistor.

A further object of the present invention is to form with high precision a junction depth of an impurity region of a MOS transistor.

A further object of the present invention is to combine PSD and DDD structures for a MOS transistor of enhanced integration scale.

A MOS device according to the present invention comprises a conductive electrode layer on surfaces of a pair of source and drain impurity regions. The source and drain regions have a double diffused structure including a first portion of a higher concentration and a second portion of a lower concentration having a wider diffused area than the first portion.

The double diffused structure provides a moderate distribution of impurity concentration in boundary portions of the source and drain impurity regions. Thus, it becomes possible to suppress electric field concentration at end surfaces of the impurity regions and to prevent a short channel effect due to generation of hot carriers.

According to another aspect of the present invention, high temperature processing such as formation of a gate oxide layer by thermal oxidation is effected at an early step. After that, impurity is implanted into conductive layers to be source and drain electrode layers, and impurity regions are formed in the semiconductor substrate by thermal diffusion. Consequently, the impurity regions formed with a predetermined junction depth in the semiconductor substrate by the thermal diffusion are no longer exposed to the high temperature atmosphere and, thus, the shallow junctions can be formed with high precision.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in detail with reference to the drawings.

First, a sectional structure of a MOS transistor according to the embodiment will be described with reference to FIG. 1K. An oxide film 2 for device isolation is formed on a surface of a p type silicon substrate 1. A pair of impurity regions 6 and 7 are formed with a spacing on the surface of the p type silicon substrate 1. The pair of impurity regions 6 and 7 constitute source and drain regions of the transistor. The source and drain regions 6 and 7 have a double diffusion structure including n+ impurity regions 6a and 7a of high concentration and n− impurity regions 6b and 7b of low concentration. Further, electrode layers 5 of polysilicon are formed on respective surfaces of the source and drain regions 6 and 7. The electrode layers 5 extend over the surfaces of the oxide film 2. A surface region of the p type silicon substrate 1 located between the source and drain regions 6 and 7 constitute a channel region 4 of the transistor. A gate oxide film 3 of a thickness of about 150 Å is formed on a surface of the channel region 4. A gate electrode 14 of polysilicon is formed on a surface of the gate oxide film 3. The gate electrode 14 partially extends over the source and drain electrode layers 5. A silicon oxide film 8 of a thickness of about 500 to several hundreds of Å is formed between the gate electrode 14 and the outgoing electrode layers 5. The silicon oxide film 8 insulates the gate electrode 14 from the outgoing electrode layers 5.

The MOS transistor of the above described structure has the below described features.

(a) The source and drain regions 6 and 7 have the double diffusion structure including the n+ impurity regions 6a and 7a and the n− impurity regions 6b and 7b. The double diffusion structure has a gradual profile of impurity concentration in the source and drain regions. Thus, it becomes possible to prevent electric field concentration particularly near the drain region due to voltage applied between the source and the drain regions 6 and 7. As a result, the so-called short channel effect due to generation of hot carriers by the electrode field concentration can be prevented. Accordingly, deterioration of the transistor characteristics can be prevented.

(b) The outgoing electrode layers 5 are formed on the respective surfaces of the source and drain regions 6 and 7. The source and drain regions 6 and 7 are connected with the connection layers over the isolation oxide film 2 by means of these outgoing electrode layers 5. Thus, direct contact with the source and the drain regions 6 and 7 can be avoided and the areas of the source and the drain regions 6 and 7 can be reduced.

(c) The upper portions of the gate electrode 14 extend over the upper surfaces of the outgoing electrode layers 5. This structure makes it possible to reduce the channel region and to ensure an effective sectional area for conduction of the gate electrode 14. Thus, the channel region 4 is reduced without causing increase in the connection resistance of the gate electrode layer 14.

Next, a method of manufacturing a MOS transistor according to this embodiment will be described with reference to FIGS. 1A to 1K.

Figure 1A:
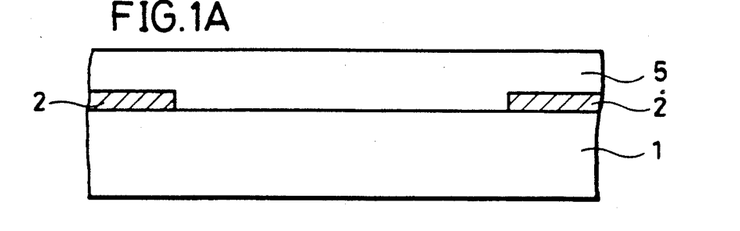
FIGS. 1A to 1K are sectional views showing successive steps of a method of manufacturing a MOS transistor according to a first embodiment of the present invention.

First, as shown in FIG. 1A, an oxide film 2 for device isolation is formed on a surface of a p type silicon substrate 1. The isolation oxide film 2 may be formed with a large thickness on the surface of the p type silicon substrate 1 by using an LOCOS (local oxidation of silicon) method for example. Subsequently, a polysilicon layer 5 of a thickness of about 2000 to 3000 Å is deposited over the surface of the silicon substrate 1 by using a reduced pressure CVD (chemical vapor deposition) method.

Figure 1B:
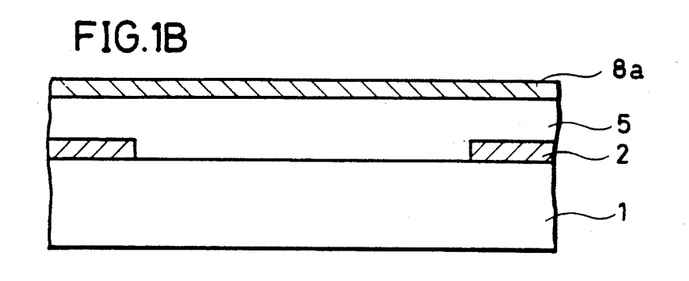

Then, as shown in FIG. 1B, a silicon oxide film 8a of a thickness of about 2000 to 3000 Å is deposited on the surface of the polysilicon layer 5 by using the CVD method.

Figure 1C:
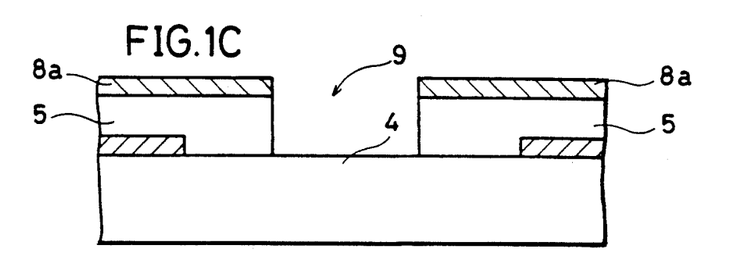

Further, as shown in FIG. 1C, the silicon oxide film 8a and the polysilicon layer 5 are selectively etched by using a reactive ion etching process, whereby an opening 9 attaining the surface of the silicon substrate 1 is formed. A width of the opening 9 is about 0.5 μm. The surface region of the silicon substrate 1 exposed in the opening 9 is a channel region 4 of the transistor.

Figure 1D:
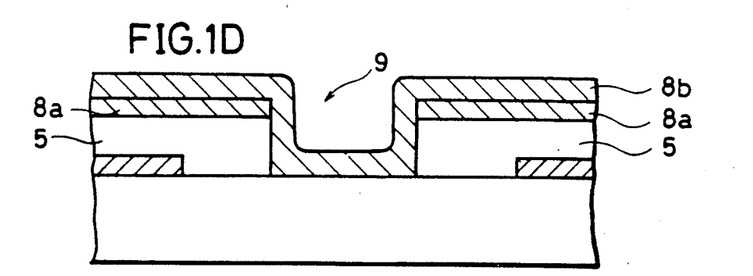

Next, as shown in FIG. 1D, a silicon oxide film 8b is deposited on the silicon oxide film 8a and inner walls of the opening 9 by using the CVD method.

Figure 1E:
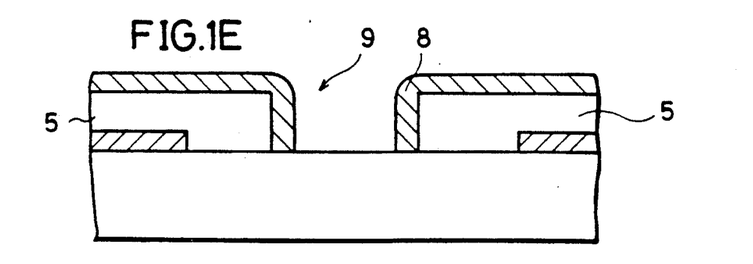

Subsequently, as shown in FIG. 1E, the silicon oxide film 8b is etched by an anisotropic etching process such as reactive ion etching process. By this anisotropic etching process, sidewall spacers of the silicon oxide film are formed on sidewalls of the polysilicon layer 5 facing the opening 9, leaving the silicon oxide film 8a on the upper surfaces of the polysilicon layer 5. As a result, a continuous silicon oxide film 8 of a thickness of about 500 to 1000 Å is formed on the side surfaces and the upper surfaces of the polysilicon layer 5.

Figure 1F:
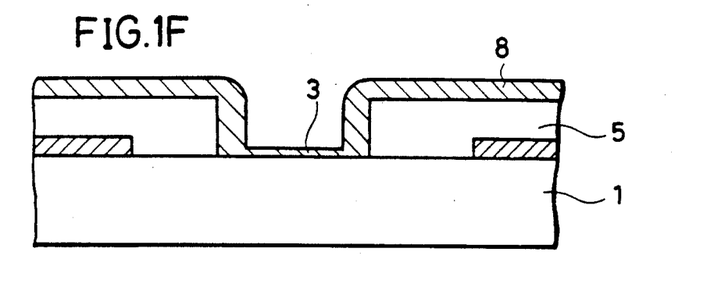

Further, as shown in FIG. 1F, a thermal oxidation process is applied in an atmosphere at a high temperature of 820° to 950° C., whereby a gate oxide film 3 of a thickness of about 150 Å is formed on the surface of the silicon substrate 1 exposed in the opening 9. In this thermal oxidation process, the silicon oxide film 8 formed in the previous step is further formed to have a larger thickness.

Figure 1G:
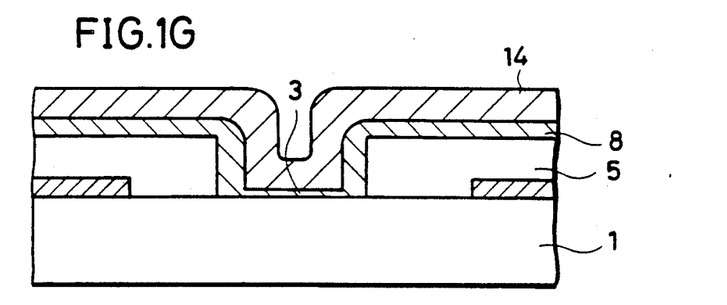

Subsequently, as shown in FIG. 1G, a polysilicon layer 14 is deposited on surfaces of the gate oxide film 3 and the silicon oxide film 8 by using the reduced pressure CVD method.

Figure 1H:
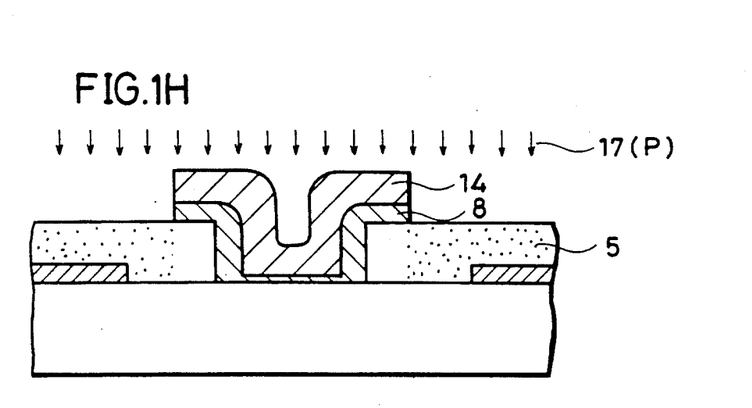

Then, as shown in FIG. 1H, the polysilicon layer 14 and the silicon oxide film 8 are simultaneously patterned in a predetermined form by using a photolithographic process and an etching process. The silicon oxide film 8 may be left as it is without being patterned. The patterned polysilicon layer 14 constitutes a gate electrode 14 of the MOS transistor. The gate electrode 14 is formed to extend over surfaces of the polysilicon layer 5 through the silicon oxide film 8. Subsequently, phosphorus (P) ions 17 with a dose of $1 \times 10^{15}/cm^2$ are implanted into the polysilicon layer 5 using the gate electrode 14 as a mask. Energy for this ion implantation is set so that the phosphorus ions 17 remain in the polysilicon layer 5, that is, it is set to about 30 KeV.

Figure 1I:
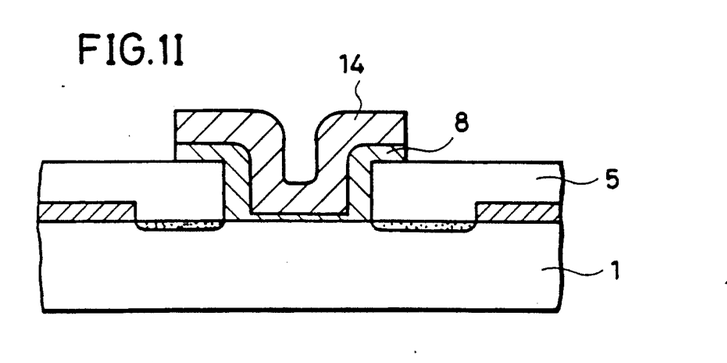

Then, as shown in FIG. 1I, the heat treatment is applied at a high temperature of about 900° C., whereby the phosphorus ions 17 implanted in the polysilicon layer 5 are thermally diffused to the surface regions of the silicon substrate 1. In this thermal diffusion process, the heating temperature and the process period are controlled, whereby a diffusion depth of the impurity is controlled.

Figure 1J:
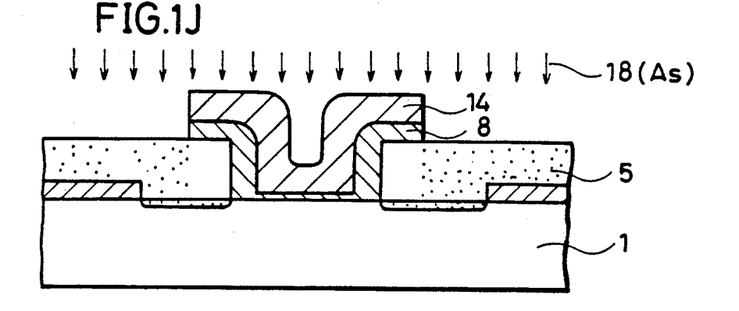

Further, as shown in FIG. 1J, arsenic (As) ions 18 are implanted into the polysilicon layer 5 using the gate electrode 14 as a mask with an implantation energy of 50 KeV and a dose of $4 \times 10^{15}/cm^2$.

Figure 1K:
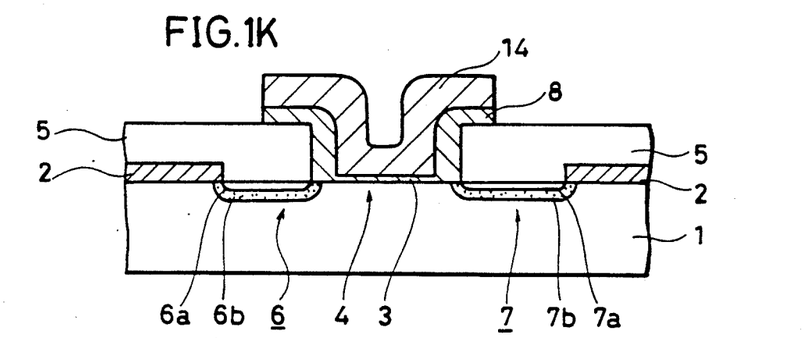

After that, as shown in FIG. 1K, a thermal diffusion process is applied at a high temperature of about 950° C., whereby the arsenic ions 18 implanted in the polysilicon layer 5 are diffused to surface regions of the silicon substrate 1. The diffusion depth of the arsenic ions 18 is controlled in the same manner as in the previous step of diffusion of phosphorus ions 17 by controlling a heating temperature and a process period. The diffusion depth of the arsenic ions 18 is set shallower than that of the phosphorus ions 17.

Thus, by the two thermal diffusion processes, the source and drain regions 6 and 7 are formed on the surface of the silicon substrate 1, having a double diffusion structure including n+ impurity regions 6a and 7a containing high concentration arsenic ions and n− impurity regions 6b and 7b containing low concentration phosphorus ions 17.

After that, an interlayer insulating film is formed over the whole surface and the outgoing electrode layers are connected with connection layers. Thus, the manufacturing of the transistor is completed.

Figure 2:
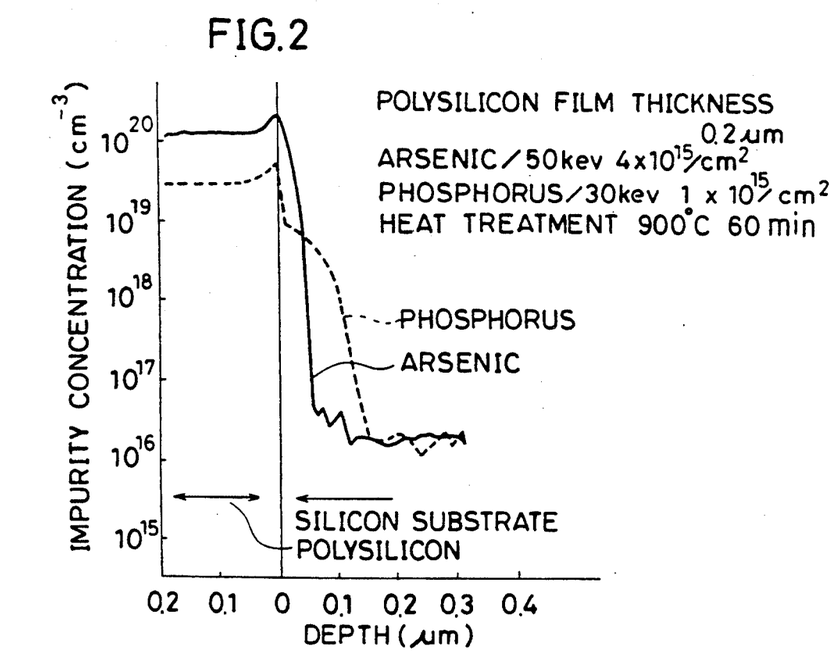
FIG. 2 is a graph showing impurity concentration distribution in source and drain regions of the MOS transistor manufactured according to the first embodiment of the present invention.

As described above, the source and drain regions 6 and 7 of the double diffusion structure are formed by the respective two independent processes of ion implantation and thermal diffusion. Consequently, the diffusion depth of the low concentration impurity regions 6b and 7b and that of the high concentration impurity regions 6a and 7a can be controlled independently with high precision. FIG. 2 shows an example of an impurity distribution profile in the source and drain regions formed by such a method as described above. In FIG. 2, the abscissa represents a depth in a direction perpendicular to the main surface of the silicon substrate 1 and the ordinate represents impurity concentration. The impurity concentration curves represent a double diffusion state of phosphorus and arsenic and particularly the high concentration arsenic region is formed with a shallow depth of 0.1 μm or less.

In addition, in the above described embodiment, the processes for ion implantation into the electrode layers 5 and thermal diffusion to the silicon substrate 1 are applied after the processes at high temperatures such as the process of deposition of the silicon oxide films 8a and 8b and the process of thermal oxidation of the gate oxide film 3. Consequently, the impurity regions formed in the silicon substrate 2 are never diffused again after the thermal diffusion process due to thermal influences in other processes. Therefore, the impurity regions of shallow junctions can be formed with high precision, which meets the requirements for fine reduction of the device structure.

Figure 3A:
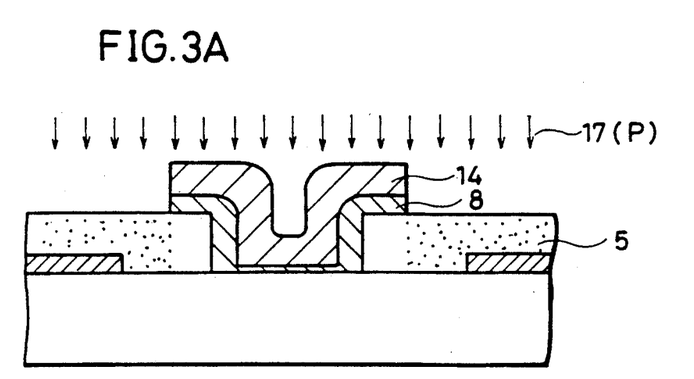
FIGS. 3A to 3C are sectional structural views showing another example of a method of manufacturing a MOS transistor according to the present invention.
Figure 3B:
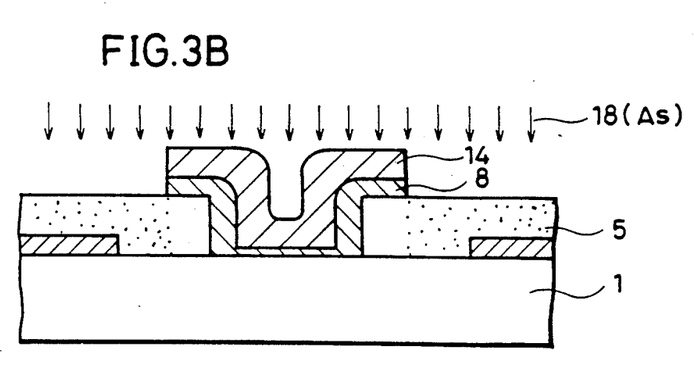
Figure 3C:
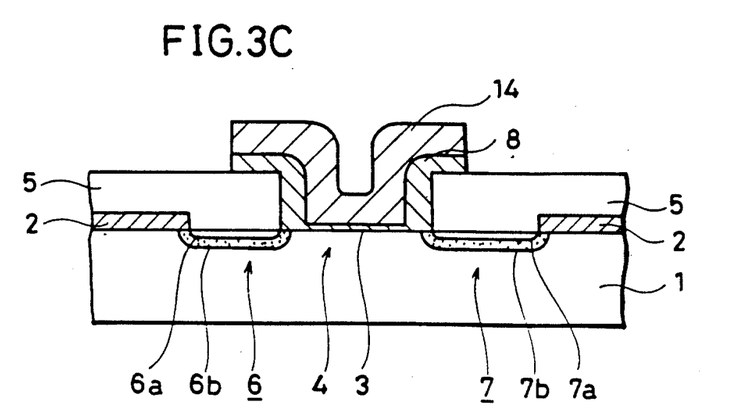

Next, a second embodiment of the present invention will be described. The second embodiment is a variant of the manufacturing method of the first embodiment. More specifically, as shown in FIGS. 3A and 3B, phosphorus ions 17 and arsenic ions 18 are successively implanted into the electrode layers 5. After that, for example, as described with reference to FIG. 3C, heat treatment at high temperature of about 900° C. is applied and the phosphorus ions 17 and the arsenic ions 18 are simultaneously thermally diffused from the electrode layers 5 into the silicon substrate 1. The phosphorus ions 17 have a larger thermal diffusion coefficient than that of the arsenic ions 18. Accordingly, if the thermal diffusion process is applied under the same conditions, the phosphorus ions 17 are diffused into the silicon substrate 1 more deeply than the arsenic ions 18. Because of these characteristics, the source and drain regions 6 and 7 of a double diffusion structure are automatically formed.

A third embodiment will be described. The third embodiment is a variant of the first embodiment. The impurities used in the first and second ion implantations for forming a double diffused drain structure are arsenic/arsenic or boron/boron.

A fourth embodiment of the present invention will be described. The fourth embodiment is a variant of the first embodiment. In this fourth embodiment, the source and drain regions 6 and 7 are formed by a single-layer impurity region. Also in this fourth embodiment, the thermal diffusion process is effected as the final process which constitutes the features of the present invention, and thus, the impurity region of the shallow junction can be formed.

Although the n channel MOS transistor was described in the above described embodiments, the present invention is also applicable to p channel MOS transistors.

As described above, in the manufacturing method according to the present invention, the thermal diffusion processes for forming the impurity regions are effected after the high-temperature processes. Thus, it is possible to form impurity regions of shallow junctions suitable for a finely reduced structure of a MOS transistor. Further, by combination of the ion implantation processes and the thermal diffusion processes, impurity regions of a double diffusion structure can be formed in a semiconductor substrate with high precision. This structure makes it possible to prevent a short channel effect caused by a fine structure of the device. Therefore, according to the present invention, a MOS transistor of a fine structure having excellent electric characteristics can be obtained.

The foregoing and other objects, features, aspects and advantages of the present invention will become more apparent from the following detailed description of the present invention when taken in conjunction with the accompanying drawings.

What is claimed is:

1. A metal-oxide-semiconductor transistor device, comprising:
   a semiconductor substrate of a first conductivity type and having a major surface;
   source and drain impurity regions of a second conductivity type formed in said semiconductor substrate;
   source and drain electrodes made of polysilicon formed on said major surface of said substrate and contacting said source and drain impurity regions;
   a gate electrode having a first portion separated by a first insulating layer having a first thickness from the major surface of said semiconductor substrate and a second portion separated from said source and drain electrodes by a second insulating layer having a second thickness greater than said first thickness, said second insulating layer extending over said source and drain electrodes, said first and second insulating layers being contiguous to each other,
   each of said source and drain impurity regions being formed of a first portion having a first impurity concentration and located in said semiconductor substrate substantially only under said source and drain electrode and a second portion adjacent to the gate electrode and having a second impurity concentration lower than said first impurity concentration.

2. A metal-oxide-semiconductor transistor device in accordance with claim 1, wherein
   said second portions of said source and drain impurity regions underlie and surround respectively said first portions.

3. A metal-oxide-semiconductor transistor device in accordance with claim 2, wherein
   said first and second portions of said source and drain impurity regions include respectively impurities having different diffusion coefficients.

4. A metal-oxide-semiconductor transistor device according to claim 1 wherein said first portion of said source and drain impurity regions has a shallow depth in said semiconductor substrate in the range of 0.1 μm or less.

5. A metal-oxide-semiconductor transistor device according to claim 1 wherein said first portion of said source and drain impurity regions has a shallow depth in said semiconductor substrate in the range of 0.05 μm to 0.1 μm.

* * * * *